United States Patent
Limb et al.

(10) Patent No.: US 8,951,825 B1
(45) Date of Patent: Feb. 10, 2015

(54) SOLAR CELL TEXTURING

(71) Applicant: Palo Alto Research Center Incorporated, Palo Alto, CA (US)

(72) Inventors: Scott J. H. Limb, Palo Alto, CA (US); Dirk DeBruyker, San Jose, CA (US); Sean Garner, San Francisco, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/023,423

(22) Filed: Sep. 10, 2013

(51) Int. Cl.
*H01L 21/00* (2006.01)
*H01L 31/18* (2006.01)
*H01L 21/308* (2006.01)

(52) U.S. Cl.
CPC .............. *H01L 31/18* (2013.01); *H01L 21/308* (2013.01); *Y10S 438/964* (2013.01)
USPC ............................................ 438/71; 438/964

(58) Field of Classification Search
USPC ....................... 438/71, 78, 694, 945, 946, 964
See application file for complete search history.

(56) References Cited

U.S. PATENT DOCUMENTS

| | | | |
|---|---|---|---|
| 3,842,189 A | 10/1974 | Southgate | |
| 5,613,861 A | 3/1997 | Smith et al. | |
| 5,949,123 A | 9/1999 | Le et al. | |
| 6,663,944 B2 | 12/2003 | Park et al. | |
| 6,709,699 B2 * | 3/2004 | Ema et al. | 427/240 |
| 7,241,420 B2 | 7/2007 | Hantschel et al. | |
| 7,325,903 B2 | 2/2008 | Peeters | |
| 7,325,987 B2 | 2/2008 | Peeters | |
| 7,563,722 B2 | 7/2009 | Yaniv et al. | |
| 7,749,448 B2 | 7/2010 | Hantschel et al. | |
| 7,828,983 B2 | 11/2010 | Weber et al. | |
| 8,080,221 B2 | 12/2011 | Hantschel et al. | |
| 8,080,293 B2 | 12/2011 | Hantschel et al. | |
| 8,129,212 B2 | 3/2012 | Wijekoon et al. | |
| 8,241,509 B2 | 8/2012 | Hantschel et al. | |
| 8,287,744 B2 | 10/2012 | Hantschel et al. | |
| 8,288,195 B2 | 10/2012 | Wang et al. | |
| 8,309,389 B1 | 11/2012 | Alie et al. | |
| 2005/0285104 A1 * | 12/2005 | Jeong | 257/48 |
| 2012/0075368 A1 * | 3/2012 | Mikami et al. | 347/9 |
| 2014/0065735 A1 * | 3/2014 | Koshiba et al. | 438/14 |

* cited by examiner

*Primary Examiner* — Kevin M Picardat
(74) *Attorney, Agent, or Firm* — Bever, Hoffman & Harms, LLP; Patrick T. Bever

(57) ABSTRACT

Multicrystalline silicon (mc-Si) solar cells having patterned light trapping structures (e.g., pyramid or trough features) are generated by printing a liquid mask material from an array of closely-spaced parallel elongated conduits such that portions of the mc-Si wafer are exposed through openings defined between the printed mask features. Closely spaced mask pattern features are achieved using an array of conduits (e.g., micro-springs or straight polyimide cantilevers), where each conduit includes a slit-type, tube-type or ridge/valley-type liquid guiding channel that extends between a fixed base end and a tip end of the conduit such that mask material supplied from a reservoir is precisely ejected from the tip onto the mc-Si wafer. The exposed planar surface portions are then etched to form the desired patterned light trapping structures (e.g., trough structures).

20 Claims, 9 Drawing Sheets

SOLAR CELL TEXTURING

FIELD OF THE INVENTION

This invention relates to solar cells, and in particular to methods for generating light trapping structures on multi-crystalline solar cell wafers.

BACKGROUND OF THE INVENTION

Solar cell texturing is an important process step that improves light trapping performance and increases overall efficiency.

Currently, mono-crystalline wafers are textured using KOH etchants that form pyramidal structures. These structures formed along crystal planes result in very good light trapping properties.

On the other hand, multi-crystalline-Si (mc-Si) wafers have to be isotropically etched. For multi-crystalline wafers, an industry-standard isotexture process is used that involves etching the entire wafer surface using a suitable etchant, typically an HF/Nitric/Acetic Acid mixture. The isotexture process utilizes the irregularity of the kerf damage to roughen the surface.

Although the isotexture process is cost effective, the resulting isotextured surface is far from optimal compared to patterned features. The textured surfaces have improved light trapping properties but are less effective than pyramidal or trough structures. According to an NREL/1366 report, using a trough structure, an absolute efficiency improvement of 0.3% has been calculated compared to an isotextured surface. Additionally, with the best light trapping structures (random pyramids), up to 0.8% absolute efficiency increase can be achieved.

An alternative to the isotexture process involves printing an etch mask on the mc-Si wafer, and then etching the wafer regions exposed through the mask to form patterned light trapping features. However, traditional mask printing techniques such as ink jet, screen printing or flexography can't meet the minimum linewidth specs, and newer techniques such as micro contact printing, dip pen nanolithography (DNP, using AFM-type probes as write tips) or other MEMS approaches are too slow, fragile or don't provide sufficient vertical clearance over large areas.

What is needed is a cost-effective method for generating patterned pyramid or trough features in multi-crystalline wafers that avoids the problems associated with conventional methods.

SUMMARY OF THE INVENTION

The present invention is directed to a method for generating a patterned light trapping structure (e.g., pyramid or trough features) on a planar surface of a multi-crystalline silicon wafer in a cost-effective manner that involves printing a liquid mask material onto the wafer by way of an array of closely-spaced parallel elongated conduits, where the liquid mask material is caused to flow along each of the conduits and a portion of the mask material is ejected from a tip portion of each of the conduits onto the wafer surface. The wafer is simultaneously moved under the conduit array such that the ejected mask material portions form a mask material pattern on a first portion of the wafer surface, and such that a second portion of the wafer surface is exposed through openings defined in the mask material pattern. The exposed planar surface portions are then etched (e.g., HF/Nitric/Acetic Acid Mixture) such that the remaining multi-crystalline silicon wafer forms the desired patterned light trapping structures (e.g., trough structures). The mask material pattern is then optionally removed either through a liftoff process in the texture etch bath or through a base soluble solution. By utilizing closely-spaced conduits to "print" parallel mask features on the target mc-Si substrate prior to etching, the present invention greatly increases mask printing speeds over conventional methods, thereby facilitating the production of mc-Si solar cell having desirable patterned light trapping structures (e.g., pyramid or trough features) at a significantly lower cost than is possible using conventional methods.

In accordance with an aspect of the invention, each of the conduits includes a capillary channel extending between a base portion and its tip portion, where each capillary channel has a small nominal channel width in the range of 3 to 10 µm (e.g., 5 microns), and where transmitting the liquid mask material involves causing sufficient liquid mask material to flow along the capillary channels such that the ejected mask material portions form a mask feature on the wafer surface that has a specified nominal width (e.g., approximately 10 microns or less) and nominal thickness (e.g., in the range of 1 to 10 microns). By ejecting liquid mask material through such conduits, the present invention facilitates a mask printing method that both meets minimum line-width specifications associated with the formation of solar cells, and deposits sufficient mask material to facilitate one-pass printing of the mask feature (i.e., printing sufficient mask material to avoid a second printing layer), making this approach superior to ink-jet, screen printing and flexography approaches. In one embodiment, the conduits are attached to and extend from a printhead substrate, and transmitting the liquid mask material involves supplying the liquid mask material to a reservoir defined in the printhead substrate that feeds the mask material to the conduits such that the liquid mask material portions simultaneously flow along and are ejected from all of conduits. This arrangement facilitates forming very thin, closely-spaced conduits (e.g., 1,000 conduits or more per inch), thereby providing a high through-put printing process that meets the minimum line width requirements associated with the production of solar cells. In one embodiment, the multi-crystalline silicon wafer is moved by way of a conveying mechanism (e.g., a conveyor belt) at a high speed (e.g., 125 mm/s or greater) under the conduit array. By matching the flow of mask material through the printhead with the speed of the conveying mechanism, the present invention provides a high speed, single pass mask printing method that facilitates the formation of patterned light trapping structures on multi-crystalline silicon wafers in a highly cost-effective manner.

In accordance with an embodiment of the invention, the printhead comprises parallel curved stressed-metal micro-spring conduits having a base portion attached to the printhead substrate and a body portion that curves away from the printhead substrate such that the tip (free end) portion of each micro-spring conduit is offset (i.e., disposed away from) the printhead substrate. Each micro-spring conduit defines at least a portion of an associated capillary channel into which the liquid mask material is supplied (i.e., such that the liquid mask material simultaneously flows from the base portion and along the body portion to the tip portion of each micro-spring conduit). By forming conduits using stressed-metal micro-springs, the present invention utilizes a modified version of a proprietary ClawConnect™ fabrication process that has a proven yield suitable for producing printheads meeting the printing requirements set forth above, and providing printheads that are significantly more robust than conventional printing arrangements. In one embodiment the printhead is segmented such that each printhead segment is approximately 3" long and includes more than 3,000 micro-springs disposed in a linear array. In accordance with a specific embodiment, the liquid mask material flows along slit-like capillary channels defined between adjacent pairs of micro-springs. In another specific embodiment, the liquid mask material flows along tube-like capillary channels defined in each of the micro-spring conduits. In yet another specific embodiment, the liquid mask material flows along liquid guiding channel structures (e.g., either a ridge-like structure or a valley/channel that channels viscous liquid mask material) disposed on each micro-spring conduit. Each of the specific embodiments utilizes proven fabrication techniques that provide robust printheads having long operating lifetimes (i.e., suitable for producing 150,000 6-inch solar cells or more).

In accordance with an alternative embodiment of the invention, the conduits comprise straight cantilever sections formed, for example, by portions of a polyimide sheet that is etched using UV laser micromachining. Each cantilever section has a base portion attached to the substrate body, and extends away from the substrate body to an end (tip) portion. Because thin (25 to 50 µm thick) polyimide is very compliant, it is envisaged such a printhead can 'scribe' the entire wafer without breaking or failing (much like a paintbrush), similar to the compliant curved cantilevers, and opposed to, e.g., micro-machined straight silicon cantilever arrays, which are very brittle. Also, polyimide is easily patterned using state of the art laser micromachining and the required small features can be obtained by, e.g., a 265 nm UV laser system.

According to alternative embodiments, the transmission of liquid mask material to the conduits is achieved by several possible mechanisms. In one specific embodiment, the liquid mask material is delivered in precise quantities (amounts) through one or more inkjet printheads to the conduits, where the inkjet nozzles are positioned above the base portion of each individual cantilever-type conduit, and ink is metered using drops from the printhead. In a second specific embodiment, the liquid mask material is delivered through one or more pressurized manifolds that feed the ink, for example, into tube-like conduits. In yet specific embodiment, the liquid mask material is delivered to the conduits by controlling a viscosity gradient of said liquid material delivered to said plurality of conduits through heating of the printhead substrate adjacent to the ink reservoir. The temperature gradients are thus employed in the printhead manifold to create a viscosity gradient, which is used to meter ink onto the conduits. The temperature is controlled either through segmented heaters or by creating a thermal gradient from the back of the printhead manifold.

In addition to parallel conduits having tip portions that are aligned, several alternative conduit arrangements are selectively utilized to provide redundancy or to increase production rates. In one specific embodiment, the conduits are formed with staggered tip portions that reduces the chance of merging of the printed ink lines (i.e., formed by ink/mask material forced along the conduits and ejected from the staggered tip portions), and facilitates decreased line pitch. In a second specific embodiment, several sets of conduits are arranged in series such that two or more tip portions are disposed over each print line, allowing simultaneously printing from the series-arranged conduits such that a first ejected mask material portion from a first conduit is deposited on top of a second ejected mask material portion from a second series-arranged conduit. The series arrangement also facilitates redundancy by allowing use of the second conduit to "take the place" of the first series-arranged conduit when the first conduit fails to operate properly. In yet another specific embodiment, multiple sets of series-arranged conduits are spaced at a distance longer than an anticipated print length (e.g., at a distance greater than the length of each wafer), and printing is performed using series column multiplexing such that mask material is printed from multiple conduits along each print line, thereby increasing print speed, decreasing print path lengths, and reducing ink reservoir feed times.

According to alternative embodiments, the mask material is printed in predetermined patterns on the multi-crystalline wafer such that subsequent etching of the exposed multi-crystalline silicon wafer produces a desired light trapping structure pattern. For example, in one specific embodiment the mask material is continuously ejected from each conduit as the wafer passes under the tip portions, thereby producing a mask comprising continuous parallel mask lines such that subsequent etching produces parallel groove-type light trapping structures in the wafer surface. In one specific embodiment the mask material is continuously ejected while reciprocating the printhead lateral to the process direction (i.e., perpendicular to a movement direction of the wafer), whereby the ejected mask material forms wavy lines over associated portions of the wafer surface. In other specific embodiments, the continuous straight or wavy mask material lines are overlapped or otherwise caused to define dot-like exposed planar surface portions of said multi-crystalline silicon wafer on the multi-crystalline silicon wafer, whereby subsequent etching of the dot-like exposed regions produces pit-type light trapping structures. In yet other specific embodiments, the mask material is printed as a series of overlapping "dots" (e.g., by intermittently contacting the tip portions of the conduits against the wafer surface, where the mask material dots are contiguously arranged to either form straight or wavy lines, or to define dot-like exposed planar surface portions. To facilitate the intermittent contact approach, in addition to existing conduit production processes, additional coatings or materials are deposited on the tip portion of each conduit (cantilever) in order to improve the mechanical wear characteristics (which could pose a specific problem for pen-tip printing). In particular, a material such as iridium is deposited (e.g., by sputtering) on either the released micro-spring structure, or before the electroplating step (after which the iridium is masked in order to not overcoat it). In another embodiment, a material such as rhodium is electroplated on each micro-spring's tip portion (after an electroplating step forming the cantilever body). Both iridium and rhodium are very hard and durable materials, so these coatings serve to improve the lifetime of the printhead.

According to yet another alternative embodiment, the liquid mask material is delivered from two printheads having offset conduits such that first mask material lines generated by one printhead are disposed between second mask material lines generated by the other printhead, whereby spacing between adjacent conduits on each printhead is made larger to improve printhead production yields.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in methods for printing mask patterns used to generate light trapping structures on multi-crystalline silicon wafers during the production of low-cost solar cells. The following description is presented to enable one of ordinary skill in the art to make and use the invention as provided in the context of a particular application and its requirements. As used herein, directional terms such as "upper", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
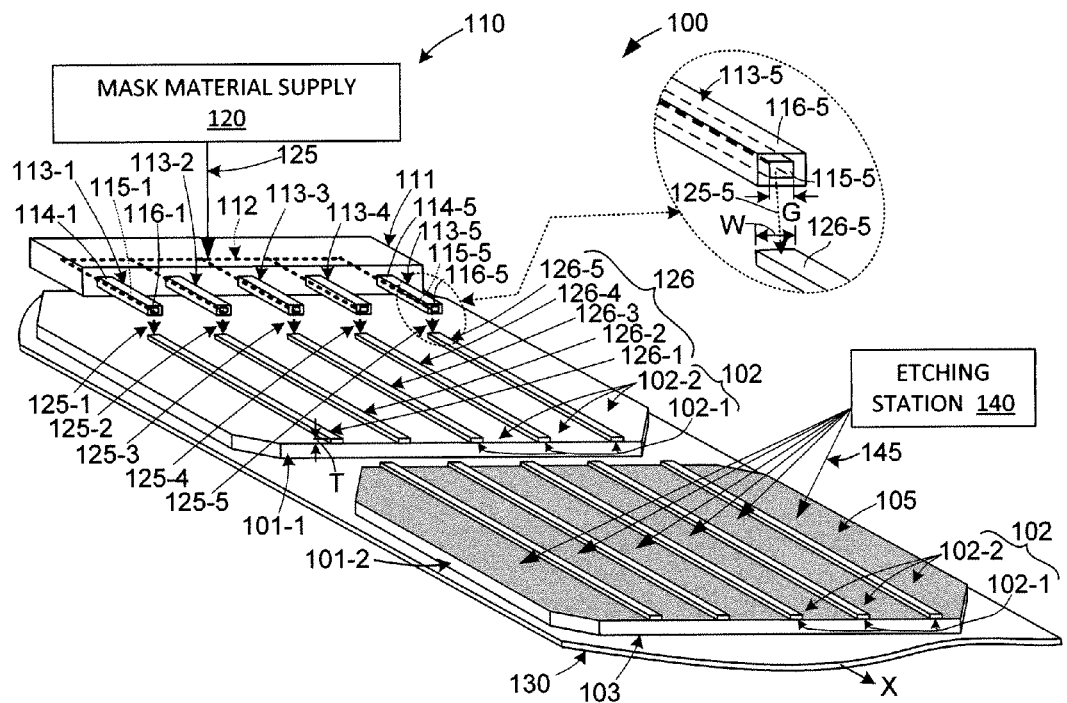
FIG. 1 is a top side perspective view showing a system for generating a patterned light trapping structure on a multi-crystalline silicon wafer according to a generalized embodiment of the present invention.
Figure 2:
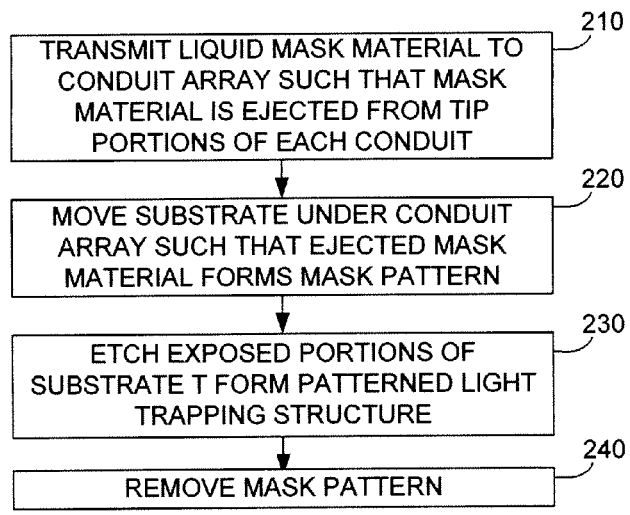
FIG. 2 is a flow diagram showing a simplified method for generating patterned light trapping structure utilizing the system of FIG. 1.

FIG. 1 is a top side perspective view showing a system 100 for generating integral patterned light trapping structure 105 on planar surfaces 102 of multi-crystalline silicon (mc-Si) wafers 101-1 and 101-2, and FIG. 2 is a flow diagram showing a method for generating integral patterned light trapping structure 105 using system 100 according to a generalized embodiment of the present invention. The term "integral" in the phrase "integral patterned light trapping structure" denotes that light trapping structures 105 are entirely formed by portions of the mc-Si material making up wafers 101-1 and 101-2 (e.g., by etching/removing adjacent portions of the mc-Si wafer material), and distinguishes the phrase "integral patterned light trapping structure" from light trapping structures that are deposited or otherwise formed on wafers 101-1 and 101-2. Although depicted by shaded areas in FIG. 1 for illustrative purposes, it is understood that patterned light trapping structures 105 comprise three-dimensional mc-Si structures (e.g., pyramid or trough features) that are formed by etching/removing portions of planar wafer surface 102.

As indicated in FIG. 1, system 100 generally includes a printhead assembly 110 that receives a liquid mask material 125 from a mask material supply 120, a conveyor belt 130 for transporting multi-crystalline silicon (mc-Si) wafers 101-1 and 101-2 under printhead assembly 110, and an etching station 140 for applying an etchant 145 onto wafers 101-1 and 101-2.

Referring to the upper portion of FIG. 2, the generalized method includes transmitting liquid mask material 125 to printhead assembly 110 such that mask material 125 is ejected from tip portions of an array of conduits 113-1 to 113-5 (block 210). As indicated at the top of FIG. 1, printhead assembly 110 includes a substrate 111 having a reservoir 112 that receives mask material 125 from supply 120, and closely-spaced parallel elongated conduits 113-1 to 113-5 that extend in parallel from substrate 111. Each conduit 113-1 to 113-5 communicates with mask material source 120 such that liquid mask material 125 (preferably an organic compound such as wax, resin, polymer, fatty acid, and ester) is transmitted (flows) from reservoir 112 into conduits 113-1 to 113-5. Each elongated conduit 113-1 to 113-5 includes a base portion attached to substrate 111, a tip portion disposed away from substrate 111, and a body portion that defines a capillary flow channel for channeling the flow of mask material from reservoir 112 to the tip portion. For example, conduit 113-1 includes a flow channel 115-1 extending along its body portion between a base portion 114-1 and a tip portion 116-1, and conduit 113-5 includes a flow channel 115-5 extending between a base portion 114-5 and a tip portion 116-5. As indicated by the dashed-line oval in the upper right portion of FIG. 1, the transmission (flow) of liquid mask material 125 involves utilizing one of the flow generating methods described below to cause a flow of sufficient liquid mask material along the capillary channel of each conduit 113-1 to 113-5 (e.g., along channel 115-5 of conduit 113-5) such that ejected mask material portions 125-1 to 125-5 form a mask material pattern 126 made up of closely-spaced mask features 126-1 to 126-5 (e.g., continuous lines or series of contiguous "dots") on surface 102. For example, as indicated by the dash-lined arrows in FIG. 1, mask material portion 125-1 flows from reservoir 112 along channel 115-1 before being ejected from tip portion 116-1 of conduit 113-1 to form mask feature 126-1 on upper surface 102 of wafer 101-1. At the same time, mask material portion 125-5 flows from reservoir 112 along channel 115-5 and is ejected from tip portion 116-5 of conduits 113-5 to form mask feature 126-5 on upper surface 102 of wafer 101-1. Mask material portions 125-2, 125-3 and 125-4 are similarly simultaneously ejected from conduits 113-2, 113-3 and 113-4, respectively, to form mask features 126-2 to 126-4 upper surfaces 102 of wafers 101-1 and 101-2.

Referring to block 220 of FIG. 2, the method further includes moving wafers 101-1 and 101-2 under printhead assembly 110 (i.e., under the conduit array) such that ejected mask material 125 forms a mask material pattern 126 on each wafer. According to the exemplary embodiment shown in FIG. 1, wafers 101-1 and 101-2 are moved by a conveyor 130 at a continuous high speed (e.g., 125 mm/s or greater) under 113-1 to 113-5 (i.e., while the liquid mask material is being ejected from tip portions of conduits 113-1 to 113-5) such that ejected mask material portions 125-1 to 125-5 generate mask material pattern 126 in the form of spaced-apart line-like features 126-1 to 126-5 on upper surface 102 of wafers 101-1 and 101-2. In one embodiment, conveyor 130 is a belt-type moving structure that supports and moves wafers 101-1 and 101-2 at a constant speed under conduits 113-1 to 113-5 (e.g., in the direction of arrow "X" in FIG. 1) such that elongated line-like features 126-1 to 126-5 cover (mask) associated spaced-apart surface portions of wafers 101-1 and 101-2. Specifically, as indicated on wafer 101-1, features 126-1 to 126-5 are disposed on "masked" portions 102-1 of planar upper surface 102, where each adjacent pair of features (e.g., features 126-1 and 126-2) is separated by a trench-like exposed surface portion 102-2. By matching the flow of mask material 125 through printhead 110 with the wafer speed of provided by conveying mechanism 130, the present invention provides a high speed, single pass mask printing method that facilitates the formation of patterned light trapping structures 105 on multi-crystalline silicon wafers 101-1 and 101-2 in a highly cost-effective manner.

As indicated by block 230 in FIG. 2, after forming mask material pattern 126, wafers 101-1 and 101-2 are then moved under or through etching station 140, where etchant 145 is applied onto upper surface 102 of each wafer to form integral patterned light trapping structures 105. According to an aspect of the present invention, as depicted by the shaded surfaces on wafer 101-2 in FIG. 1, etchant 145 is applied such that it etches (i.e., removes portions of) exposed planar surface portions 102-2 of each wafer such that the remaining (etched) mc-Si wafer material (i.e., the portions protected from etchant 145 by mask features 126-1 to 126-5) form integral patterned light trapping structures 105. In an exemplary embodiment, etchant 145 comprises one of HF/Nitric/Acetic Acid Mixture) that is applied such that the remaining multi-crystalline silicon wafer material forms desired patterned light trapping structures 105 (e.g., trough structures).

Referring to block 240 at the bottom of FIG. 2, mask material pattern 126 is then optionally removed using a known techniques. For example, the mask can be fully undercut and lifted off the substrate where the mask is filtered out of the etch bath. Another method would be to etch the mask material in a basic solution using KOH or $K_2CO_3$.

The method of FIG. 2 provides a cost-effective method for generating patterned pyramid or trough features in multi-crystalline wafers 101-1 and 101-2. That is, by ejecting liquid mask material through conduits 113-1 to 113-5 in the manner described herein, the present invention facilitates a mask printing method that meets minimum line-width specifications associated with the formation of solar cells in a manner that is more cost-effective than ink-jet, screen printing and flexography approaches.

In accordance with an aspect of the invention, each conduit 113-1 to 113-5 comprises a cantilever-type structure having a (fixed) base portion attached to substrate 111 and a tip portion disposed away from substrate 111, and defines/includes a capillary (flow) channel that controls (i.e., channels) the flow of mask material from the base portion to the tip portion of each conduit. For example, referring to the dashed-line bubble indicated at the upper-right portion of FIG. 1, conduit 113-5 includes a tube-type structure surrounding (defining) a capillary channel 115-5 that extends between base portion 114-5 and tip portion 116-5, where capillary channel 115-5 communicates with reservoir 112 such that mask material portion 125-5 enters channel 115-5 through an open (first) end disposed adjacent to base portion 114-5, is channeled (flows) along conduit 113-5 from base portion 114-5 toward tip portion 116-5, and is ejected from an open (second) end at tip portion 116-5 to form mask feature 126-5. Conduits 113-1 to 113-4 similarly communicate with reservoir 112 to channel mask material portions 125-1 to 125-4 such that they form mask features 126-1 to 126-4, respectively. Each capillary channel of conduits 113-1 to 113-5 has a micron-level nominal channel width that facilitates the formation of narrow mask features. For example, as indicated in the dashed-line bubble in the top-right portion of FIG. 1, capillary channel 115-5 has a nominal channel width (gap distance G) in the range of 3 to 10 microns that facilitates the formation of line-type mask feature 126-5 having a nominal width W of approximately 10 microns or less). A benefit of utilizing cantilever-type conduits 113-1 to 113-5 is that sufficient liquid mask material is delivered (e.g., flows along capillary channels 115-1 to 115-5) such that the ejected mask material portions 125-1 to 125-5 form mask features 126-1 to 126-5 having both the desired nominal width W and a nominal thicknesses T in the range of 1 to 10 microns), whereby the mask printing process is achieved in a "single-pass" printing step. That is, by ejecting liquid mask material 125 through conduits 113-1 to 113-5 in the manner described herein, the present invention facilitates a mask printing method that both meets minimum line-width specifications associated with the formation of solar cells, and deposits sufficient mask material to facilitate single-pass printing of the mask features (i.e., printing sufficient mask material to avoid a second printing layer), making this approach superior to ink-jet, screen printing and flexography approaches. This arrangement also facilitates forming very thin, closely-spaced conduits (e.g., 1,000 conduits or more per inch), thereby providing a high through-put printing process that meets the minimum line width requirements associated with the production of solar cells.

Figure 3:
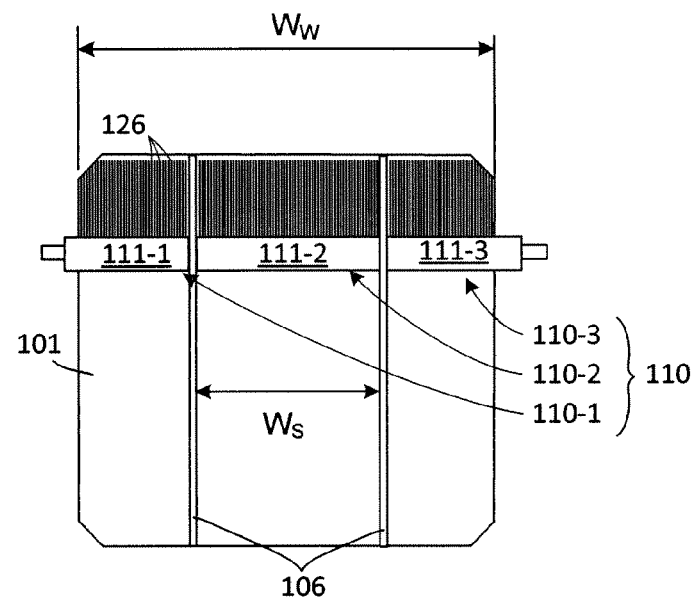
FIG. 3 is a top plan view showing a mask printing process according to an embodiment of the present invention.

FIG. 3 is a top plan view showing a mask printing process in which an mc-Si wafer 101 is moved under (i.e., downward in the figure) printhead 110, and multiple parallel line-like mask features 126 are printed onto wafer 101 using the method described above. In this case, printhead 110 includes three segments 110-1, 110-2 and 110-3 (i.e., formed on three separate substrates 111-1, 111-2 and 111-3) that are arranged end-to-end such that they span the width $W_W$ of wafer 101, where each segment 110-1, 110-2 and 110-3 is positioned to deposit mask material on a corresponding section of wafer 101 (e.g., segment 110-2 is disposed to form mask features 126 between bus bars 106, which are typically found on mc-Si PV devices). In a specific embodiment, each segment substrate (e.g., substrate 111-2) has a nominal width $W_S$ of three inches, and wafer 101 has a width $W_W$ of six inches.

Figure 4:
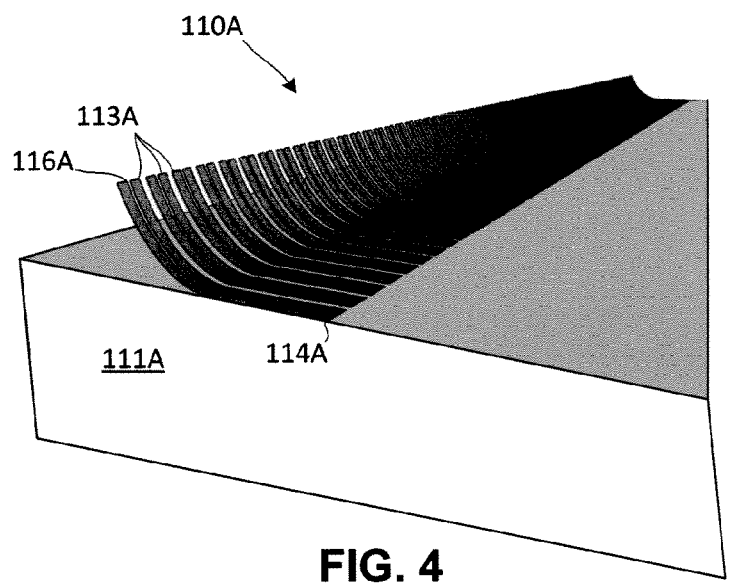
FIG. 4 is a perspective view showing an exemplary printhead including micro-spring-type conduits that is utilized in the process of FIG. 3.

FIG. 4 is a perspective view showing a single printhead segment 110A according to an embodiment of the present invention, where segment 110A includes a linear array of curved micro-spring conduits 113A that are secured in a cantilever-type arrangement to a substrate 111A. Specifically, each micro-spring conduit 113A includes a micro-spring structure having a base (fixed end) portion 114A attached to a planar surface of substrate 111A and a tip (free end) portion 116A that is offset (i.e., disposed away from) substrate 111A. In one embodiment, each micro-spring conduit 113A comprises a stress-metal micro-spring structure that is fabricated using techniques similar to those utilized in proprietary Claw-Connect™ compliant, high-density, interconnect (HDI) platform technology, which was developed by the assignee of the present invention. In accordance with ClawConnect technology, each micro-spring conduit 113A is formed using a self-bending spring metal that is deposited as a stress-engineered film and is then patterned to form spring material islands (flat structures) in which its lowermost portions (i.e., the deposited material adjacent to the upper surface of substrate 111A) has a lower internal tensile stress than its upper portions (i.e., the horizontal layers located furthest from substrate 111A), thereby causing the stress-engineered metal film to have internal stress variations that cause a narrow "finger" portion of the spring metal island to bend upward away from substrate 111A during the subsequent release process. Methods for generating such internal stress variations in stress-engineered metal films are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, a titanium (Ti) release material layer is deposited on substrate 111, then a stress-engineered metal film includes one or more of molybdenum (Mo), a "moly-chrome" alloy (MoCr), tungsten (W), a titanium-tungsten alloy (Ti:W), chromium (Cr), copper (Cu), nickel (Ni) and a nickel-zirconium alloy (NiZr) are either sputter deposited or plated over the release material. An optional passivation metal layer (not shown; e.g., gold (Au), platinum (Pt), palladium (Pd), or rhodium (Rh)) may be deposited on the upper surface of the stress-engineered metal film to act as a seed material for the subsequent plating process if the stress-engineered metal film does not serve as a good base metal. The passivation metal layer may also be provided to improve contact resistance in the completed spring structure. In an alternative embodiment, a nickel (Ni), copper (Cu) or nickel-zirconium (NiZr) film may be formed that can be directly plated without a seed layer. If electroless plating is used, the deposition of the electrode layer can be skipped. In yet another alternative embodiment, the self-bending spring material may be one or more of a bimorph/bimetallic compound (e.g., metal1/metal2, silicon/metal, silicon oxide/metal, silicon/silicon nitride) that are fabricated according to known techniques. In each instance an outer layer of highly conductive material (e.g., gold) is formed on the "base" spring metal material to increase conductivity and to facilitate micro-plasma generation. In yet another embodiment, each micro-spring conduit is fabricated such that its base (anchor) portion is connected to the underlying substrate by way of an optional support structure (e.g., a retained portion of the release layer or a pre-formed conductive base structure).

The micro-spring conduits of the present invention differ from standard micro-spring probes formed by ClawConnect technology in that the fabrication process is modified to provide suitable capillary channels that extend along the length of each micro-spring structure/conduit, whereby ejecting the liquid mask material from each micro-spring-type conduit is performed by causing portions of the mask material portion to simultaneously flow along the capillary channels formed on or by portions of the micro-spring structures. Exemplary capillary channel features are described below with reference to FIGS. 5-7.

Figure 5A:
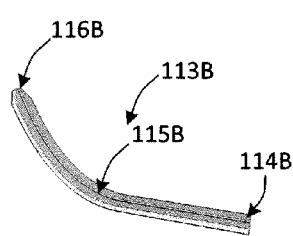
FIGS. 5A and 5B are perspective side and front views, respectively, showing a micro-spring conduit according to a first specific embodiment.
Figure 5B:
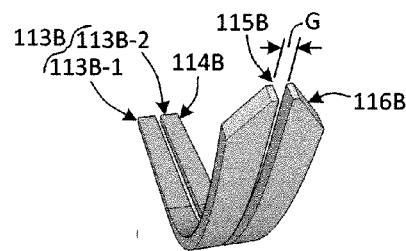

FIGS. 5A and 5B are perspective side and front views, respectively, showing a micro-spring conduit 113B including a slit-like capillary channel 115B according to a first specific embodiment. Each micro-spring conduit 113B includes an associated pair of parallel curved stressed-metal micro-springs 113B-1 and 113B-2 having base portions 114B attached to a substrate (not shown) and tip portions 116B disposed away from the substrate in the manner described above with reference to FIG. 3, where associated micro-springs 113B-1 and 113B-2 are spaced such that slit-like capillary channel 115B is defined therebetween. In this case, transmitting the liquid mask material involves supplying the mask material to a point between base portions 114B of micro-springs 113B-1 and 113B-2 such that the mask material flows along slit-like capillary channel 115B and is ejected from between tip portions 116B. By forming micro-springs 113B-1 and 113B-2 with a nominal gap distance G in the range of 3 to 10 microns, the mask material is maintained in slit-like capillary channel 115B by way of capillary action (force) as it flows between base portions 114B and tip portions 116B. Techniques for generating closely-spaced micro-spring conduits that can be used for liquid flow are disclosed, for example, in co-owned U.S. Pat. No. 7,241,420 ("CAPILLARY-CHANNEL PROBES FOR LIQUID PICKUP, TRANSPORTATION AND DISPENSE USING STRESSY METAL"), which is incorporated herein by reference in its entirety.

Figure 6A:
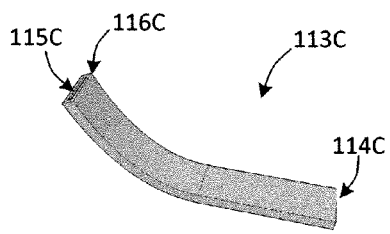
FIGS. 6A and 6B are perspective side and front views, respectively, showing a micro-spring conduit according to a second specific embodiment.
Figure 6B:
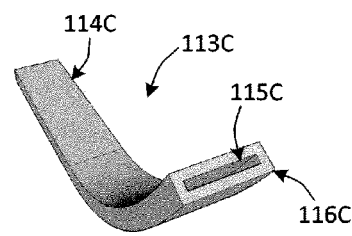

FIGS. 6A and 6B are perspective side and front views, respectively, showing a tube-like micro-spring conduit 113C according to a second specific embodiment. In this case, liquid mask material flows in a hollow tube-like capillary channel 115C that is defined (i.e., surrounded on four sides) by walls having, for example, a rectangular cross-section), where tube-like capillary channel 115C extends between base end 114C and tip end 116C of micro-spring conduit 113C. In this case, mask material is fed into capillary channel 115C from an enclosed reservoir (not shown) at a pressure that generates the required flow. Techniques for generating tube-like micro-spring conduits that can be used for liquid flow are disclosed, for example, in co-owned U.S. Pat. No. 8,080,293 ("MICRO-MACHINED STRUCTURE PRODUCTION USING ENCAPSULATION"), which is incorporated herein by reference in its entirety.

Figure 7:
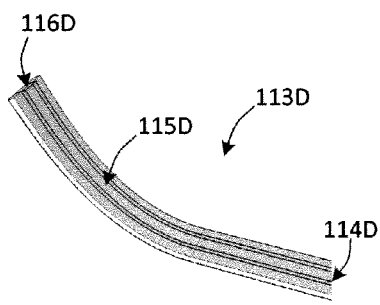
FIG. 7 is a perspective side view showing a micro-spring conduit according to a third specific embodiment.
Figure 7A:
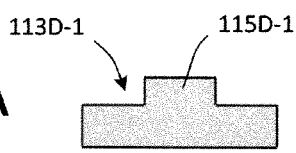
FIGS. 7A, 7B and 7C are cross-sectional views showing alternative flow channel features utilized by the micro-spring conduit according to alternative specific embodiments.
Figure 7B:
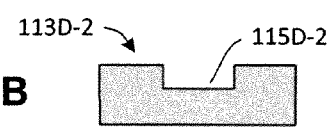
Figure 7C:
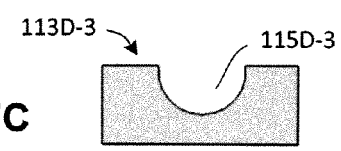

FIG. 7 is a perspective side view showing a patterned micro-spring conduit 113D according to a third specific embodiment, and FIGS. 7A, 7B and 7C are cross-sectional views showing alternative liquid guiding channel types utilized by patterned micro-spring conduit 113D. As with the slit-like channel described above with reference to FIGS. 5A and 5B, each micro-spring conduit 113D includes an associated liquid guiding channel structure 115D that serves to control the flow of liquid mask material by capillary action as it travels from a base portion 114D to a tip portion 116D along each micro-spring conduit 113D. However, instead of being formed using two adjacent micro-springs, conduit 113D includes a single micro-spring structure that is modified (patterned) to include liquid guiding channel structure 115D on or defined in a surface thereof, where liquid guiding channel structure 115D includes a shape that facilitates capillary liquid flow between base portion 114D and tip portion 116D. FIG. 7A shows a first micro-spring conduit 113D-1 having a ridge-type liquid guiding channel structure 115D-1 formed by a rib that extends upward from a central surface region of conduit 113D-1. FIG. 7B shows a second micro-spring conduit 113D-2 having a valley- or groove-type liquid guiding channel structure 115D-2 formed as a square or rectangular trough that extends into the upper surface along the entire length of conduit 113D-2. FIG. 7C shows a third micro-spring conduit 113D-3 having another valley/groove-type channel structure 115D-3 formed as a semi-circular trough (valley) that extends into the upper surface along the entire length of conduit 113D-3. An advantage of the liquid guiding channel structures illustrated in FIGS. 7A-7C is that they are fabricated using existing ClawConnect technologies, and are therefore believed to provide robust printheads having long operating lifetimes (i.e., suitable for producing 150,000 6-inch solar cells or more).

Figure 8:
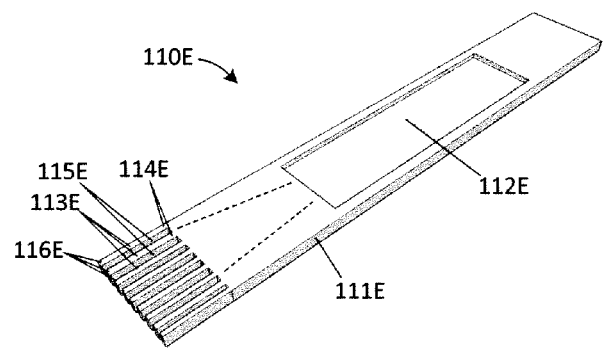
FIG. 8 is a top side perspective view showing a printhead according to another embodiment of the present invention.

Although the present invention is preferably implemented using micro-spring conduits, other technologies may also be utilized. For example, FIG. 8 is a top side perspective view showing a printhead segment 110E including straight parallel cantilever sections 113E formed in accordance with an alternative embodiment of the present invention. In one specific embodiment, printhead segment 110E is formed by etching a polyimide sheet 111E using UV laser micromachining. Each cantilever section 113E has a base portion 114E attached to polyimide sheet (substrate body) 111E, and extends away from sheet 111E to an end (tip) portion 116E. A suitable flow channel feeds liquid mask material from a reservoir 112E formed on polyimide sheet 111E to slit-like capillary channels 115E that are defined between adjacent pairs of said plurality of straight catilever sections 113E such that ejected mask material portions simultaneously flow along all of slit-like capillary channels 115E. Because thin (25 to 50 µm thick) polyimide is very compliant, it is envisaged printhead segment 110E can 'scribe' the entire target mc-Si wafer (not shown) without breaking or failing (much like a paintbrush). That is, unlike micro-machined straight silicon cantilever arrays that are brittle and can break when brought into contact with the target mc-Si wafer, the thin polyimide cantilever sections 113E are able to flex in a manner similar to that associated with stressed-metal micro-spring cantilevers (described above). Also, polyimide is easily patterned using state of the art laser micromachining and the required small features can be obtained by, e.g., a 265 nm UV laser system.

The transmission of liquid mask material to the various conduits described above is achieved using several possible mechanisms, some of which are described below with reference to FIGS. 9A to 9C.

Figure 9A:
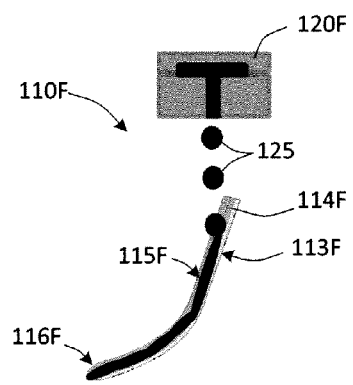
FIGS. 9A, 9B and 9C are simplified cross-sectional side views showing alternative mask material feed systems utilized in accordance with associated specific embodiments of the present invention.

FIG. 9A is simplified cross-sectional side view showing a first liquid mask material feed system in which liquid mask material 125 is delivered in precise quantities (drops) through one or more inkjet printheads 120F to conduits 113F (one shown) of a printhead 110F. The outlet nozzles of inkjet printhead 120F are positioned over each individual cantilever-type conduit 113F such that the liquid mask material 125 is supplied to base portions 114F of each conduit 113F. Printhead 110F is also arranged such that the liquid mask material 125 flows from base portions 114F along capillary channels 115F to tip portions 116F, whereby it is transferred to a target mc-Si wafer (not show) in the manner described herein. An advantage of this approach is that inkjet delivery systems are well-known mechanisms for delivering highly precise quantities of liquid material.

Figure 9B:
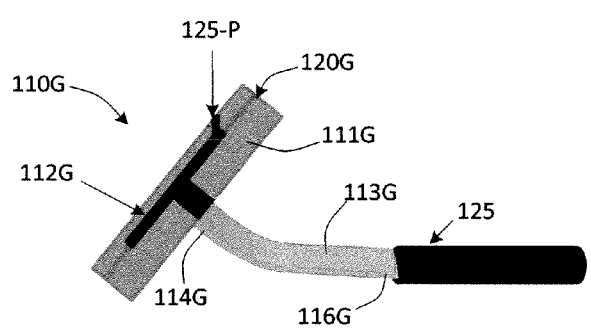

FIG. 9B is simplified cross-sectional side view showing a second liquid mask material feed system in which liquid mask material 125 is delivered through one or more pressurized manifolds 120G into tube-like conduits 113G (i.e., similar to those described above with reference to FIGS. 6A and 6B). Pressurized liquid mask material 125-P is delivered from a pump or other pressurized supply source to a reservoir 112G defined inside manifold 120G, where reservoir 112G communicates with a first end of the capillary channel located adjacent to base portion 114G of each tube-like conduits 113G, whereby liquid mask material 125 is forced along tube-like conduits 113G and is ejected from the outlet at tip portion 116F onto a target mc-Si wafer. An advantage of this second approach is that pressurized manifolds are generally less complex and less expensive to implement than inkjet delivery systems.

Figure 9C:
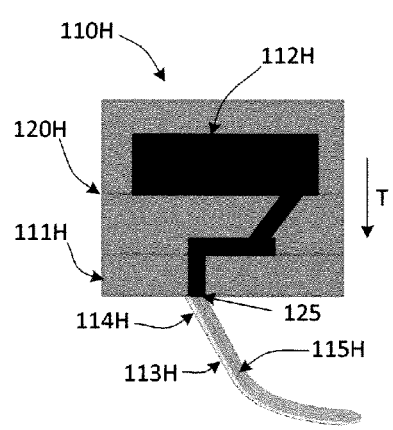

FIG. 9C is simplified cross-sectional side view showing a third liquid mask material feed system in which a viscosity gradient of liquid mask material 125 supplied to printhead 110H is controlled by heating liquid mask material 125 as it is fed from a reservoir 112H through a printhead substrate 111H to conduits 113H, whereby a temperature gradient T is generated in printhead 110H that creates the desired viscosity gradient, which is used to meter liquid mask material 125 into capillary channels 115H at base portions 114H of conduits 113H. The temperature is controlled either through segmented heaters or by creating a thermal gradient from the back of a printhead manifold 120H, whereby liquid mask material 125 having a relatively high viscosity and relatively low temperature is heated as it flows downward from reservoir 112H toward substrate 111H. The temperature gradient is set such that liquid mask material 125 undergoes both a decrease in viscosity, thereby producing a controlled flow rate that supplies liquid mask material 125 such that it flows along and is ejected from tips 116H of conduits 113H. An advantage of this third approach is that heated manifolds are generally less complex and less expensive to implement than the other two delivery systems described above.

Figure 10A:
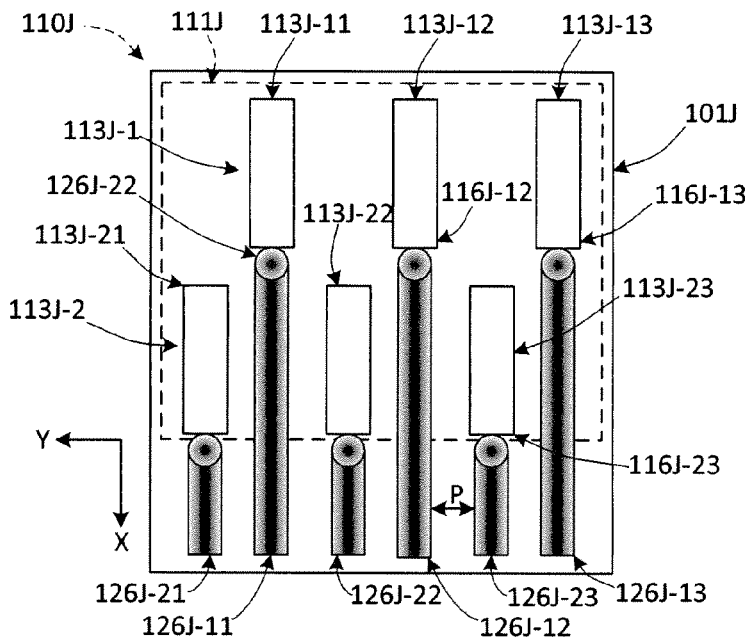
FIGS. 10A, 10B, 10C and 10D are simplified top plan views showing various conduit arrangements utilized in accordance with alternative specific embodiments of the present invention.
Figure 10B:
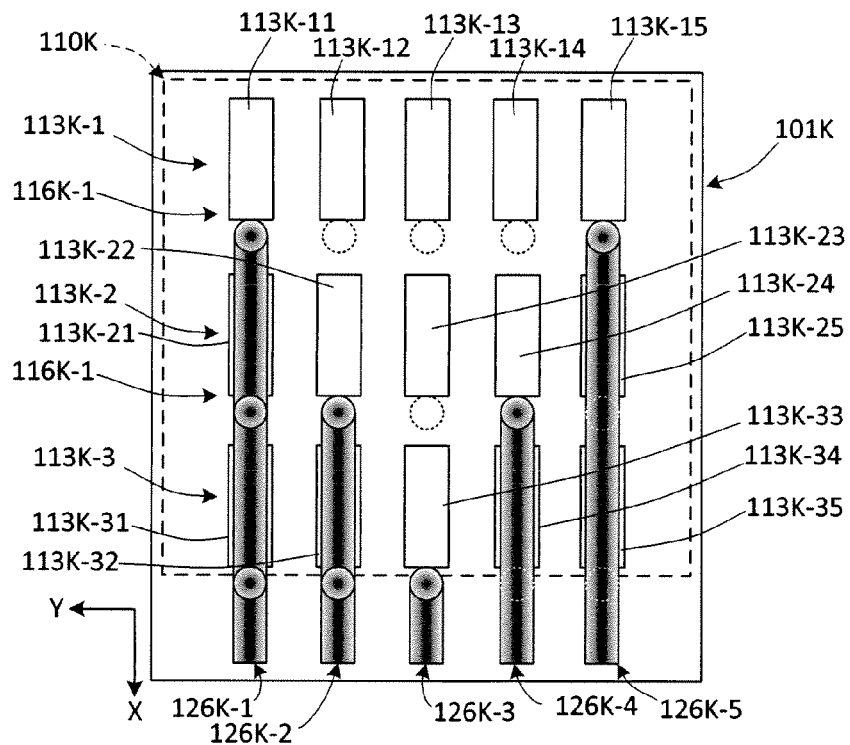
Figure 10C:
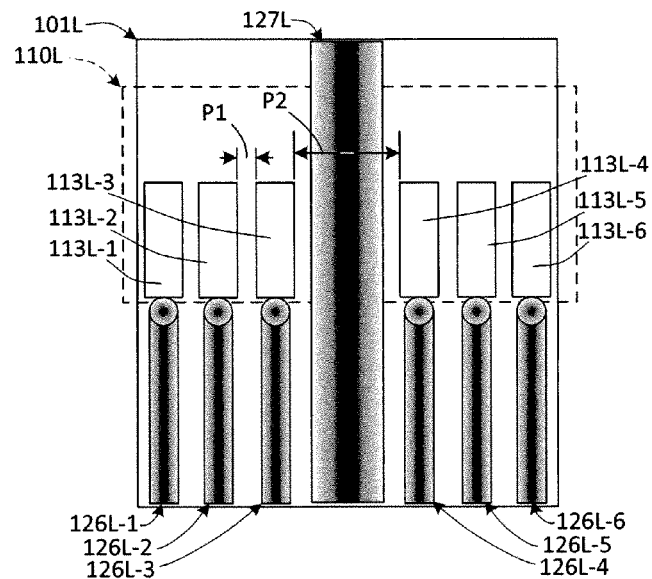

In addition to the use of parallel conduits having tip portions that are aligned, several alternative conduit arrangements described below with reference to FIGS. 10A-10C are selectively utilized to provide redundancy or to increase production rates.

FIG. 10A depicts a printhead 110J having two sets of parallel conduits 113J-1 and 113J-2 that are disposed in a staggered pattern in order to reduce the chance of merging of the printed mask material features (ink lines), and to facilitate higher production yields by providing a larger space between each adjacent pair of conduits. First set 113J-1 includes parallel conduits 113J-11, 113J-12 and 113J-13 aligned in the cross-process (Y-axis) direction that are formed on and secured to a printhead substrate 111J (shown in dashed lines to indicate the conduits are between the substrate and the wafer) in the manner described above, are utilize the methods described above to generate mask material features 126J-11, 126J-12 and 126J-13, respectively, on a target mc-Si wafer 101J. Second set 113J-2 includes parallel conduits 113J-21, 113J-22 and 113J-23 that are also aligned in the cross-process (Y-axis) direction, but conduits 113J-21, 113J-22 and 113J-23 are offset in the process/moving (X-axis) direction from first set 113J-1 by an offset distance 0. In addition, conduits 113J-21, 113J-22 and 113J-23 are offset ("staggered") in the cross-process (Y-axis) direction relative to conduits 113J-11, 113J-12 and 113J-13 such that first mask features 126J-11, 126J-12 and 126J-13 generated by first set 113J-1 are disposed between adjacent pairs of second mask features 126J-21, 126J-22 and 126J-23 generated by corresponding conduits 113J-21, 113J-22 and 113J-23 of second set 113J-2 (e.g., mask feature 126J-12 is disposed between mask features 126J-21 and 126J-22). This "staggered" arrangement facilitates the printing of closely-spaced mask material features while increasing printhead production yields by increasing the spaces separating adjacent conduits.

FIG. 10B depicts a printhead 110K having three sets of parallel conduits 113K-1, 113K-2 and 113K-3 that are disposed in an overlapping (series arranged) pattern such that mask material features ejected from downstream conduits (e.g., conduits in third conduit set 113K-3) are aligned with (i.e., may be deposited on top of) mask material features ejected from corresponding upstream conduits (e.g., conduits in first conduit set 113K-1 or second conduit set 113K-2). First set 113K-1 includes parallel conduits 113K-11, 113K-12, 113K-13, 113K-14 and 113K-15 that are aligned in the cross-process (Y-axis) direction and secured to a printhead substrate 111K (shown in dashed lines) in the manner described above. Second set 113K-2 includes parallel conduits 113K-21, 113K-22, 113K-23, 113K-24 and 113K-25 that are also aligned in the cross-process (Y-axis) direction and secured to a printhead substrate 111K, but are disposed downstream from first set 113K-1, and third set 113K-3 includes parallel conduits 113K-31, 113K-32, 113K-33, 113K-34 and 113K-35 that are also aligned and disposed downstream from second set 113K-2. Associated conduits from each set are series-aligned in the process (X-axis) direction (e.g., conduits 113K-11, 113K-21, 113K-31 are aligned in the Y-axis direction, conduits 113K-12, 113K-22, 113K-32 are aligned in the Y-axis direction, etc.).

The series arranged conduit pattern of printhead 110K facilitates simultaneously printing such that a first ejected mask material portion from a first conduit is deposited on top of a second ejected mask material portion from a second series-arranged conduit. For example, as indicated at the right side of FIG. 10B, mask feature 126K-1 is formed by three layers of mask material, with mask material ejected from conduits 113K-31 being printed on top of mask material ejected from conduits 113K-21, which in turn is printed on top of mask material ejected from conduits 113K-11.

The series arranged conduit pattern of printhead 110K also facilitates redundancy by allowing use of one or more conduits to "take the place" of a defective conduit. For example, mask feature 126K-2 is formed by two layers of mask material, with mask material ejected from conduits 113K-32 being printed on top of mask material ejected from conduits 113K-22, with conduit 113K-12 held in reserve in case one of conduits 113K-32 or 113K-22 fails to operate properly. Similarly, mask features 126K-3, 126K-4 and 126K-5 are each formed by single layer of mask material, with mask feature 126K-3 comprising mask material ejected from conduit 113K-33 (conduits 113K-23 and 113K-13 are held in reserve), mask feature 126K-4 comprising mask material ejected from conduit 113K-24 (conduits 113K-34 and 113K-14 are held in reserve), and mask feature 126K-5 comprising mask material ejected from conduit 113K-15 (conduits 113K-35 and 113K-25 are held in reserve).

FIG. 10C depicts a printhead 110L having two sets of spaced-apart conduits that are separated by a gap provided for an intervening gridline 127L, which is formed on mc-Si wafer 101L prior to the mask printing process. Specifically, conduits 113L-1, 113L-2 and 113L-3 form a first conduit set that are positioned and spaced at a pitch P1 to form mask features 126L-1, 126L-2 and 126L-3 on a first side of gridline 127L, and conduits 113L-4, 113L-5 and 113L-6 form a second conduit set that are positioned and spaced to form mask features 126L-4, 126L-5 and 126L-6 on a second side of gridline 127L, where pitch P1 is smaller than a width P2 of gridline 127L.

Figure 10D:
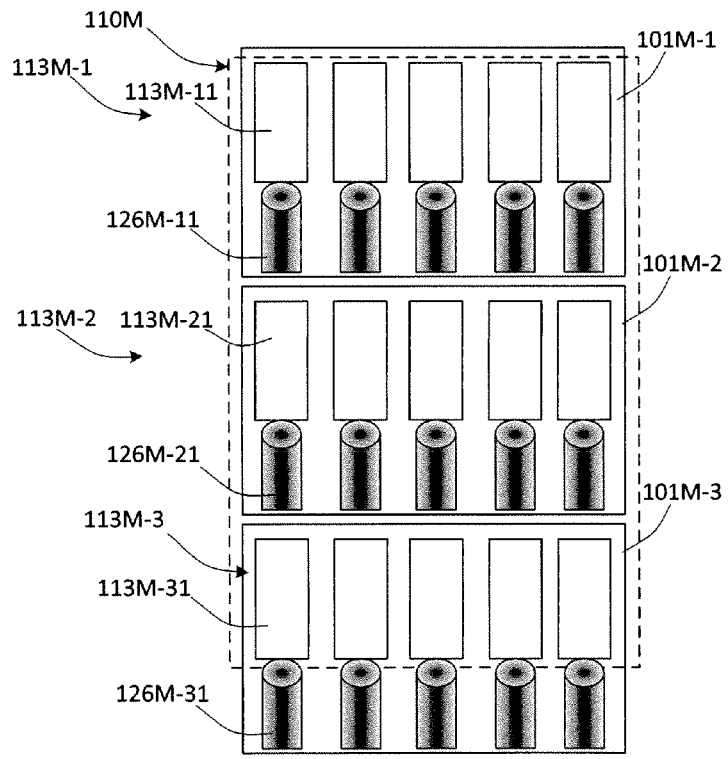

FIG. 10D depicts another printhead 110M including multiple sets of series-arranged conduits that are spaced at a distance longer than an anticipated print length (e.g., at a distance greater than the length of each of wafers 101M-1, 101M-2 and 101M-3), where printing is performed using series column multiplexing such that mask material is printed from multiple conduits along each print line, thereby increasing print speed (i.e., by allowing simultaneous mask printing on wafers 101M-1, 101M-2 and 101M-3), decreasing print path lengths, and reducing ink reservoir feed times. That is, while first set 113M-1 (e.g., conduit 113M-11) prints mask features (e.g., feature 126M-11) on wafer 101M-1, second set 113M-2 (e.g., conduit 113M-21) prints mask features (e.g., feature 126M-21) on wafer 101M-2, and third set 113M-3 (e.g., conduit 113M-31) prints mask features (e.g., feature 126M-31) on wafer 101M-3.

According to additional alternative embodiments, the printing process is performed such that mask material is printed in predetermined patterns on the mc-Si wafers, where subsequent etching of the multi-crystalline silicon material through openings in the predetermined patterns produces a desired light trapping structure pattern. There are a number of possible etch patterns that will increase the absorption of light by a solar wafer. Well-known etch patterns include grooves and so-called honeycomb textures. Exemplary preferred methods of achieving these structures with the current invention. In general, it is preferable to have the unmasked regions be small compared to the pitch of the etched features. As is well known, this will produce etched features whose depth is comparable to their width, which is desirable for light trapping.

Figure 11:
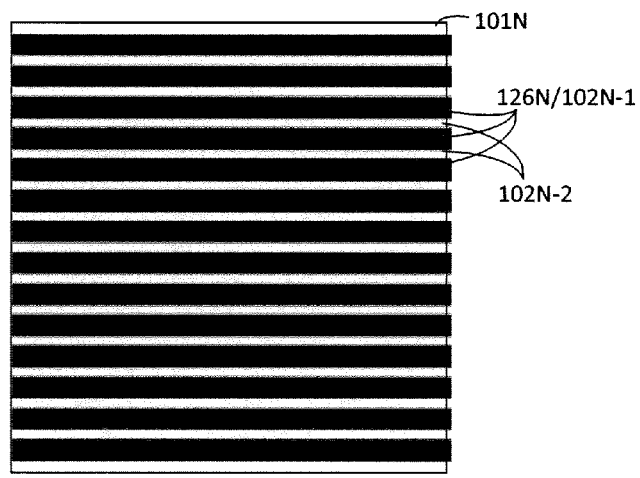
FIG. 11 is a simplified top plan view showing a wafer including a straight line mask material pattern printed in accordance with a specific embodiment of the invention.
Figure 12:
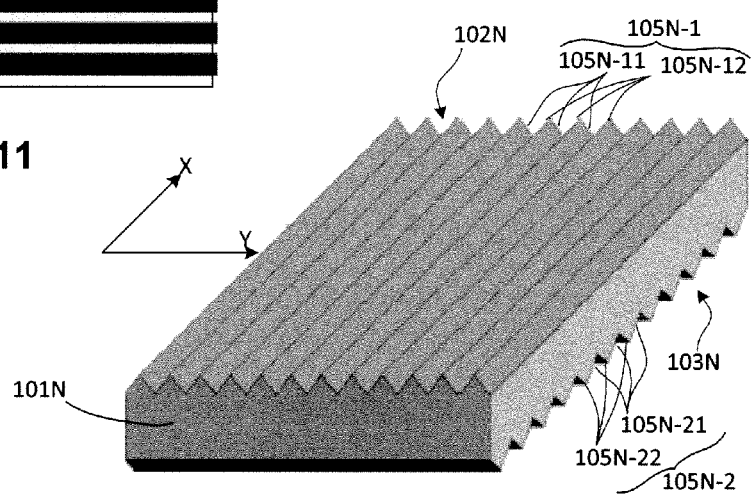
FIG. 12 is a top front perspective view showing the wafer of FIG. 11 after subsequent etching.

FIG. 11 is a simplified top plan view showing a wafer 101N including a straight line mask material pattern printed in accordance with a first specific embodiment of the invention. That is, mask 126N is formed by continuously ejecting mask material from each of the conduits of a printhead while scanning across the target wafer in a single pass such that the ejected mask material portions form continuous elongated parallel mask material lines 126N on first surface portions 102N-1 of wafer 101N, where each adjacent pair of mask material lines 126N is separated by an elongated exposed planar surface portion 102N-2. Subsequent etching of wafer 101N involves applying a suitable etchant that only accessed elongated exposed planar surface portions 102N-2 (i.e., mask portions 126N protect first surface portions 102N-1). FIG. 12 is a perspective view showing wafer 101N after the subsequent etching process forms elongated groove-type light trapping structures 105N-1 in upper surface 102N, where groove-type light trapping structures 105N-1 include elongated V-shaped grooves 105N-11 separated by corresponding elongated raised ridge-like structures 105N-12.

Referring again to FIG. 12, wafer 101N is processed to have perpendicular linear grooves on the two sides of the wafer, which allows the resulting solar cell to capture a wider variety of scattering angles according to a modified light trapping arrangement. To generate this perpendicular groove pattern, after groove-type light trapping structures 105N-1 are formed on upper surface 102N in a first process (X-axis) direction, wafer 101N is turned over and rotated 90°, and then a second mask/etch process is performed on lower surface 103N (i.e., such that wafer 101N is processed in a second process direction corresponding to the Y-axis arrow). Similar to light trapping structures 105N-1, the resulting second elongated groove-type light trapping structures 105N-2 are formed by grooves 102N-21 separated by ridge-like structures 105N-22, but are aligned perpendicular to light trapping structures 105N-1. Providing perpendicular grooves on the two sides of the target wafer achieves a wider variety of scattering angles, which increases solar cell efficiency by increasing the number of captured photons.

Figure 14A:
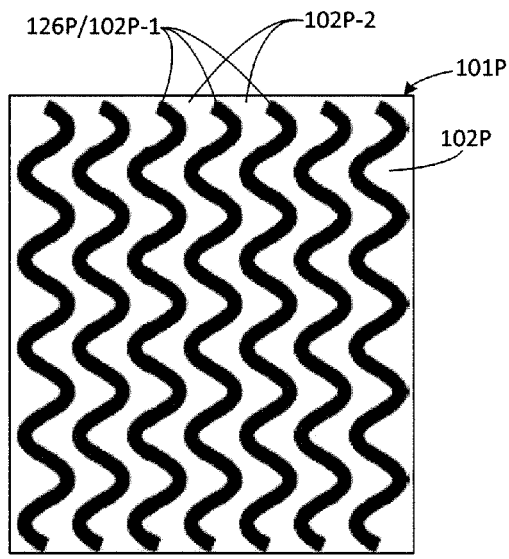
FIGS. 14A and 14B are simplified top plan views showing wafers including wavy-line mask material patterns printed in accordance with another specific embodiment of the invention.

FIG. 14(A) is a simplified diagram wafer 101P is processed to have a "wavy-line" mask pattern formed by parallel wavy mask features 126P according to another alternative embodiment. Wavy mask features 126P are formed using the printheads and wafer conveying mechanisms described above, where mask material is continuously ejected while either the conduits (printhead) or the wafer are reciprocated (moved back and forth) in the cross-process direction (i.e., lateral/perpendicular to the movement direction of the wafer), whereby the ejected mask material is deposited in the form of wavy lines 126P over associated wavy-line masked portions 102P-1 separated by wavy-line exposed areas 126P-2 of wafer surface 102P. Subsequent etching of wavy-line exposed areas 102P-2 produces a corresponding light trapping pattern that improves upon a linear 1D trough design.

Figure 13:
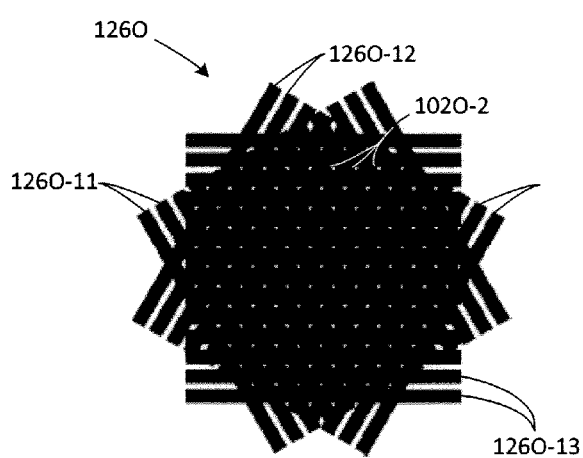
FIG. 13 is a simplified top plan view showing a wafer including another straight line mask material pattern printed in accordance with another specific embodiment of the invention.
Figure 14B:
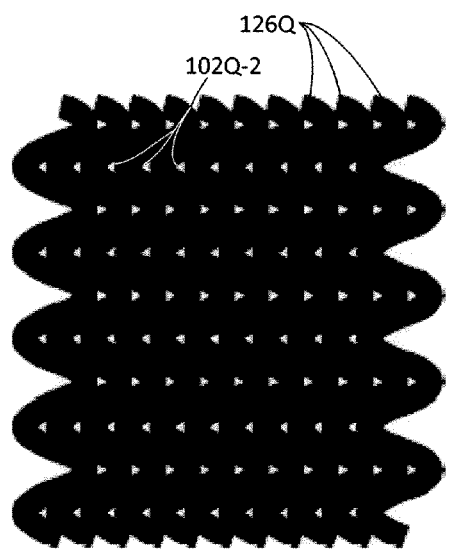

In other specific embodiments, the continuous straight or wavy mask material lines are overlapped to define dot-like exposed planar surface portions of the target mc-Si wafer, whereby subsequent etching of the dot-like exposed regions produces pit-type light trapping structures in a "honeycomb" pattern. For example, FIG. 13 illustrates a mask pattern 1260 formed by three sets of straight parallel continuous mask material line features 1260-11, 1260-12 and 1260-13 that are printed in multiple printing passes (e.g., by printing features 1260-11 as described above, then rotating the target wafer 120°, then printing features 1260-13, then rotating the target wafer 120°, then printing features 1260-13), thereby forming a pattern of exposed "hole" regions 1020-2 having triangular symmetries. When exposed "hole" regions 1020-2 are subsequently etched, light trapping features having a honeycomb pattern are formed that are believed to be superior to grooved structures because they scatter light in multiple directions in the wafer-surface plane. Similarly, as shown in FIG. 14B, a mask material pattern having a triangular lattice of exposed "hole" regions 102Q-2 is achieved by printing closely spaced "wavy" mask material features 126Q similar to those described with reference to FIG. 14A. If the triangular lattice is equilateral this will result in a honeycomb texture when etched. If not a distorted honeycomb texture will result.

Figure 15A:
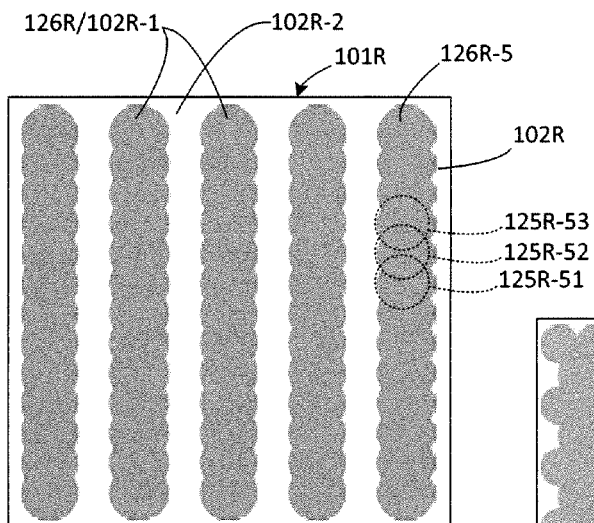
FIGS. 15A and 15B are simplified top plan views showing wafers including dot-type mask material patterns printed in accordance with another specific embodiment of the invention.
Figure 15B:
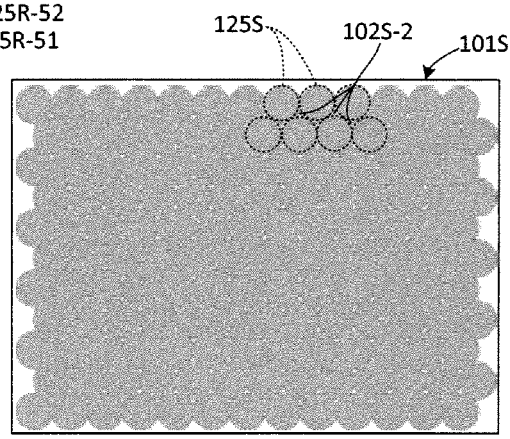

In yet other specific embodiments, the mask material is deposited as individual drops that form a series of overlapping circular dot-like mask material structures (features) on the target wafer. Such dot-like mask features may be preferable with certain combinations of process parameters, such as the selected liquid mask material "ink"). FIG. 15A shows linear mask features 126R formed as parallel rows of overlapping dot-like mask material structures that cover masked portions 102R-1 of mc-Si wafer 102R (e.g., linear mask feature 126R-5 is formed in part by dot features 126R-51, 126R-52 and 126R-53), where exposed surface regions 102R-2 are provided between the rows of dots are subsequently etched to generate groove-type light trapping structures. FIG. 15B shows a second mask pattern formed on mc-Si wafer 101S by offset rows of dot-like mask material structures 125S that define substantially triangular exposed "dots", which produce a complicated structure having three-fold symmetry when subsequently etched. Dot-like mask material structures, such as those described above with reference to FIGS. 15A and 15B, placing the pen tips into contact with the wafer surface, then out of contact, repeatedly, while translating the printhead between touches. Similarly to above, patterns with finer spacing than the pen-tip spacing may be achieved either by multiple offset printheads or by multiple dot placements with a translation of the printhead inbetween.

In addition to existing processes, it is envisaged that additional coatings or materials can be deposited on the tip region of the cantilever, in order to improve the mechanical wear characteristics (which could pose a specific problem for pen-tip printing). In particular, a material such as iridium can be deposited (by sputtering) on either the released cantilever structure, or before the electroplating step (after which it is masked in order to not overcoat it). Also, a material such as rhodium can be electroplated on the tip region (after the first electroplating step forming the cantilever 'body'). Both iridium and rhodium are very hard and durable materials, and these coatings may improve the lifetime of the printhead.

Figure 16:
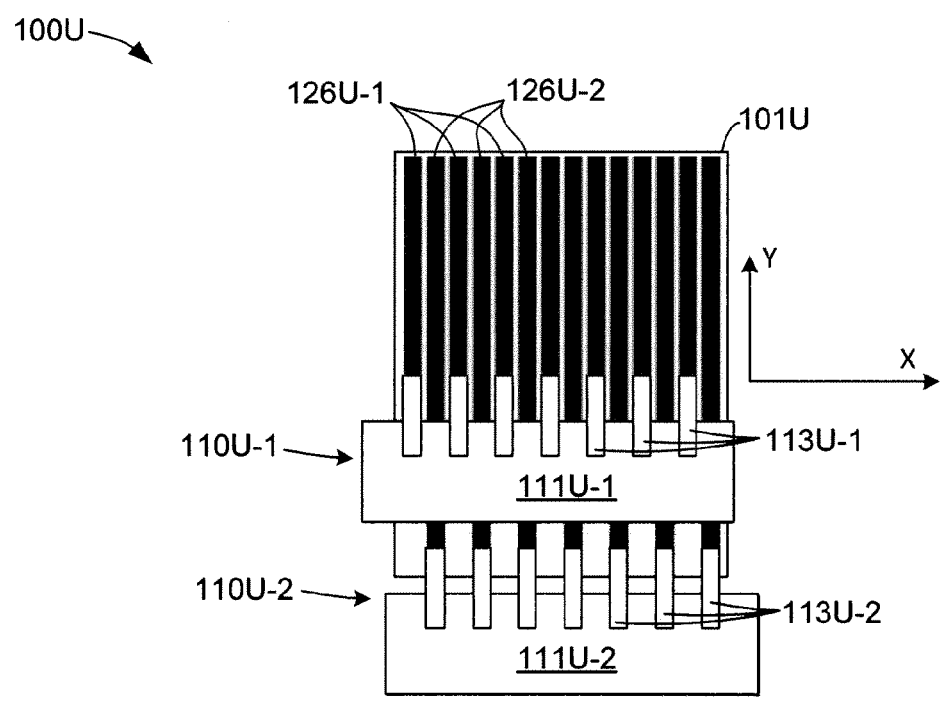
FIG. 16 is a simplified top view showing a mask printing system utilizing two offset printheads in accordance with another specific embodiment of the invention.

FIG. 16 is a simplified top view showing a mask printing system 100U utilizing printheads 110U-1 and 110U-2 in accordance with yet another specific embodiment of the invention. Printing system 100U is similar to previous embodiments in that printheads 110U-1 and 110U-2 respectively include conduits 113U-1 and 113U-2, and a target wafer 101U is moved relative to printheads 110U-1 and 110U-2 such that liquid mask material ejected (printed) from tip portions of conduits 113U-1 and 113U-2 forms line-type features 126U-1 and 126U-2 on a target wafer 101U in a manner similar to that described above. Printing system 100U differs from previous embodiments in that printheads 110U-1 and 110U-2 are maintained in a fixed relative position such that conduits 113U-1 and 113U-2 are offset in the cross-process (X-axis) direction, whereby (first) mask material lines 126U-1 generated by printhead 101U-1 are disposed between (second) mask material lines 126U-2 generated by printhead 101U-2. This arrangement allows the spacing between adjacent conduits 113U-1 and 113U-2 on each printhead 110U-1 and 110U-2 to be larger in order to improve printhead production yields.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for generating a patterned light trapping structure on a planar surface of a multi-crystalline silicon wafer, the method comprising:
   transmitting a liquid mask material along a plurality of parallel elongated conduits such that a portion of said mask material is ejected from a tip portion of each said conduit;
   moving the multi-crystalline silicon wafer under the tip portions of the plurality of conduits such that the ejected mask material portions form a mask pattern on the planar surface of the multi-crystalline silicon wafer, wherein said mask material pattern is formed such that a portion of said planar surface is exposed through said mask material pattern; and
   etching the exposed planar surface portion such that the etched multi-crystalline silicon wafer forms the integral patterned light trapping structure.

2. The method of claim 1, wherein each of the plurality of conduits comprises a capillary channel extending between a base portion and the tip portion, said capillary channel having a nominal channel width in the range of 3 to 10 microns, and wherein transmitting the liquid mask material comprises causing a sufficient amount of said liquid mask material to flow along said capillary channels such that said ejected mask material ejected from each said capillary channel forms a mask feature on said surface having a nominal width of 10 microns or less.

3. The method of claim 2, wherein transmitting the liquid mask material further comprises supplying the liquid mask material to a printhead comprising a substrate having a reservoir, wherein said plurality of conduits are attached to and extend from said substrate, and wherein said liquid mask material is supplied to said reservoir such that said ejected mask material portions simultaneously flow from said reservoir along said plurality of conduits.

4. The method of claim 3, wherein moving the multicrystalline silicon wafer comprises conveying the multicrystalline silicon wafer at a speed of at least 125 mm/s under the plurality of conduits.

5. The method of claim 4, wherein each of the plurality of closely-spaced conduits comprises a curved micro-spring structure having said base portion attached to the substrate and said tip portion disposed away from said substrate, and wherein transmitting the liquid mask material comprises causing said ejected mask material portions to simultaneously flow along capillary channels defined by portions of said each micro-spring structure.

6. The method of claim 5, wherein transmitting the liquid mask material comprises causing each said ejected mask material portion to flow along a corresponding slit-like capillary channel defined between associated pairs of said plurality of micro-springs.

7. The method of claim 5, wherein transmitting the liquid mask material comprises causing said each ejected mask material portion to flow through a corresponding tube-like capillary channel defined in an associated one of the plurality of micro-springs.

8. The method of claim 5, wherein transmitting the liquid mask material comprises causing said each said ejected mask material portion to flow along an associated liquid guiding channel structure disposed on an associated one of the plurality of micro-springs.

9. The method of claim 4, wherein the plurality of closely-spaced conduits comprises a plurality of straight cantilever sections having a base portion attached to the substrate and said tip portion disposed away from said substrate, and wherein transmitting the liquid mask material comprises causing said ejected mask material portions to simultaneously flow along corresponding slit-like capillary channels defined between adjacent pairs of said plurality of straight cantilever sections.

10. The method of claim 4, wherein transmitting the liquid mask material comprises delivering said liquid mask material through one or more inkjet printheads to said plurality of conduits.

11. The method of claim 4, wherein transmitting a liquid mask material comprises delivering said liquid material through one or more pressurized manifolds to said plurality of conduits.

12. The method of claim 4, wherein transmitting a liquid mask material comprises controlling a viscosity gradient of said liquid mask material delivered to said plurality of conduits by heating said substrate adjacent to said reservoir.

13. The method of claim 1, wherein transmitting the liquid mask material comprises forcing the liquid mask material along a first set of parallel conduits and a second set of parallel conduits, the first set being offset from the second set in a moving direction of the multicrystalline wafer, wherein the first set of parallel conduits are offset from the second set of parallel conduits in a cross-process such that each first mask feature generated by a conduit of the first set is disposed between a pair of second mask features generated by corresponding conduits of the second set.

14. The method of claim 1, wherein transmitting the liquid mask material comprises simultaneously delivering the liquid mask material to a plurality of series-arranged conduits such that a first ejected mask material portion ejected from a first conduit is deposited on top of a second ejected mask material portion ejected from a second series-arranged conduit.

15. The method of claim 14, wherein transmitting the liquid mask material comprises delivering the liquid mask material to multiple sets of series-arranged conduits such that said ejected mask material portion is simultaneously ejected from each of the multiple sets onto a corresponding said multi-crystalline wafer.

16. The method of claim 1,
wherein transmitting the liquid mask material comprises continuously delivering the mask material to each of the plurality of conduits such that said ejected mask material portions form continuous elongated parallel mask material lines separated by elongated exposed planar surface portions of the multi-crystalline silicon wafer, and
wherein said etching comprises etching said elongated exposed planar surface portions such that said etching produces elongated groove-type light trapping structures.

17. The method of claim 16, wherein transmitting a liquid mask material further comprises reciprocating the plurality of parallel elongated conduits in a direction perpendicular to a movement direction of the wafer such that the ejected mask material portions forms parallel wavy mask material lines on the multi-crystalline silicon wafer.

18. The method of claim 1,
wherein transmitting the liquid mask material comprises forming ejected mask material portions that define dot-like exposed planar surface portions of said multi-crystalline silicon wafer on the multi-crystalline silicon wafer, and
wherein etching the exposed planar surface portions comprises etching the dot-like exposed regions of said multi-crystalline silicon wafer to form pit-type light trapping structures.

19. The method of claim 1, wherein transmitting the liquid mask material comprises intermittently contacting the tip portions of the plurality of conduits against the planar surface of the multi-crystalline silicon wafer such that said ejected mask material portions form dot-like mask material structures on the multi-crystalline silicon wafer.

20. The method of claim 1, wherein transmitting said liquid mask material comprises delivering said liquid mask material to first and second printheads having offset conduits such that first portions of said mask material ejected from tip portions of said conduits disposed on the first printhead are disposed between second portions of said mask material ejected from tip portions of said conduits disposed on the second printhead.

* * * * *